(12) United States Patent
Galvez

(10) Patent No.: US 7,897,985 B2
(45) Date of Patent: Mar. 1, 2011

(54) LED LIGHT ENGINE KERNEL AND METHOD OF MAKING THE KERNEL

(75) Inventor: Miguel Galvez, Danvers, MA (US)

(73) Assignee: Osram Sylvania, Danvers, MA (US)

( * ) Notice: Subject to any disclaimer, the term of this patent is extended or adjusted under 35 U.S.C. 154(b) by 430 days.

(21) Appl. No.: 12/048,416

(22) Filed: Mar. 14, 2008

(65) Prior Publication Data

US 2009/0230414 A1 Sep. 17, 2009

(51) Int. Cl.
*H01L 33/00* (2010.01)
(52) U.S. Cl. ............ 257/98; 257/88; 257/E33.001; 257/E21.001; 438/26; 438/55
(58) Field of Classification Search ............ 257/98–100, 257/88, E21.001, E23.001; 438/26, 55
See application file for complete search history.

(56) References Cited

U.S. PATENT DOCUMENTS

| | | | |
|---|---|---|---|
| 5,727,108 A * | 3/1998 | Hed ............................... 385/133 |
| 6,095,655 A * | 8/2000 | Bigliati et al. ............... 359/853 |
| 6,577,073 B2 | 6/2003 | Shimizu et al. |
| 7,213,940 B1 | 5/2007 | Van De Ven et al. |
| 2005/0151141 A1 | 7/2005 | Grotsch et al. |
| 2007/0188876 A1 * | 8/2007 | Hines et al. ................... 359/642 |
| 2007/0225777 A1 * | 9/2007 | Heacock et al. ................ 607/88 |
| 2008/0128730 A1 * | 6/2008 | Fellows et al. ................ 257/98 |
| 2009/0129230 A1 | 5/2009 | Grotsch |
| 2010/0214196 A1 * | 8/2010 | Browaeys ...................... 345/60 |

FOREIGN PATENT DOCUMENTS

| | | |
|---|---|---|
| DE | 199 24 316 | 11/2000 |
| DE | 10 2005 018336 | 8/2006 |
| EP | 1 528 603 | 5/2005 |
| WO | WO 2006/089503 | * 8/2006 |

* cited by examiner

*Primary Examiner* — Thanh V Pham
*Assistant Examiner* — Duy T Nguyen
(74) *Attorney, Agent, or Firm* — Robert F. Clark

(57) ABSTRACT

A light engine kernel for a light emitting diode (LED) includes a solid body of transparent material having an index of refraction of at least 1.5. The body has a domed, light-emitting top that is an inverted parabola of revolution, a reflective sidewall that is a compound parabolic concentrator (CPC), and a cavity at a focus of the CPC that is adapted to receive an LED. The domed top may include a phosphor coating of a yellow-emitting phosphor. The cavity may be adapted to receive only a single LED or plural LEDs of the same or different colors on a board. The kernel and LED are not integrally formed, reducing thermal degradation of the phosphor coating and improving application flexibility.

19 Claims, 2 Drawing Sheets

US 7,897,985 B2

LED LIGHT ENGINE KERNEL AND METHOD OF MAKING THE KERNEL

BACKGROUND OF THE INVENTION

The present invention is directed to a light engine package in which light is generated from a light emitting diode (LED), and more particularly to a light engine package that produces light of a particular color using a phosphor and LED in combination.

An LED package that produces white light typically includes a blue-emitting LED embedded in a transparent polymer, such as silicone, where the polymer is either coated or impregnated with a yellow-emitting phosphor. A typical blue-emitting LED is GaN-based with an InGaN active layer that emits blue light with a wavelength of 450 to 470 nm. The yellow-emitting phosphor may include cerium-doped yttrium aluminum garnet. Part of the blue light from the LED is converted by the yellow-emitting phosphor to a spectrum of light centered at about 580 nm (yellow). This yellow light and the remaining blue light together give the appearance of white light.

Alternatively, the LED package may include LEDs and phosphors of other colors (e.g., red and green LEDs and/or red-emitting and green-emitting phosphors) to produce LED packages with particular colors other than white.

In any event, the polymer is formed on (typically molded onto) the LED so that the package includes an integral arrangement of the polymer and LED (see, for example, U.S. Pat. No. 6,577,073 in which a blue-emitting LED is molded in a material impregnated with a yellow-emitting phosphor and U.S. Pat. No. 7,213,940 in which a blue-emitting LED is encapsulated in a polymer.) This integral arrangement causes problems because the phosphor proximity to the LED leads to heat-induced lumen degradation. Thus, applications including LED packages with a phosphor require a thoughtful thermal design. Further, the formation of the polymer on the LED reduces the flexibility of application of LED packages.

It would be beneficial to develop an LED package that avoids the heat problems of the prior art and that affords more flexibility for lighting designers.

SUMMARY OF THE INVENTION

An object of the present invention is to provide a novel light engine kernel that avoids the problems of the prior art.

A further object of the present invention is to provide a novel kernel and method of making the kernel in which the body of the kernel and the LED are not integrally formed to reduce heat-induced lumen degradation and improve application flexibility.

A yet further object of the present invention is to provide a novel light engine kernel that includes a solid body of transparent material having an index of refraction of at least 1.5, where the body has a domed, light-emitting top that is an inverted parabola of revolution, an internally reflective sidewall that is a compound parabolic concentrator (CPC), and a cavity at a focus of the CPC that is adapted to receive an LED. The domed top may include a phosphor coating of a yellow-, green-, or red-emitting phosphor. The cavity may be adapted to removably receive only a single LED or plural LEDs of the same or different colors on a board. Light from the LED in the cavity reflects off of the sidewall and is uniformly distributed on the domed top.

Another object of the present invention is to provide a novel method of making this kernel by inserting the LED into the cavity after the kernel is formed.

These and other objects and advantages of the invention will be apparent to those of skill in the art of the present invention after consideration of the following drawings and description of preferred embodiments.

DESCRIPTION OF PREFERRED EMBODIMENTS

Figure 1:
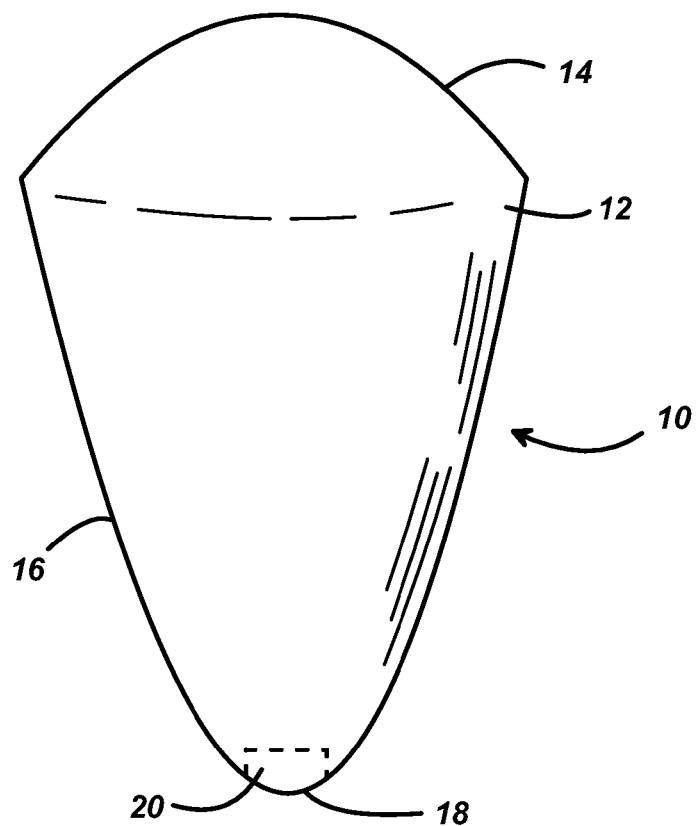
FIG. 1 is a pictorial representation of a kernel of an embodiment of the present invention.

With reference now to FIG. 1, a kernel 10 of an embodiment of the present invention includes a solid body 12 of transparent material having an index of refraction of at least 1.5. The solid body has a domed, light-emitting top 14 that is an inverted parabola of revolution, an internally reflective sidewall 16 that takes a shape of a compound parabolic concentrator (CPC), and a bottom 18 having a cavity 20 therein at a focal locus of the CPC that is adapted to receive an LED. In operation, light from the LED in the cavity internally reflects off of the sidewall and is uniformly distributed on and emitted from the domed top. The uniformity of the light distribution on the domed top provides a uniform light intensity along this surface.

The LED and kernel are not integrally formed; that is, the kernel is formed without the LED in place and the LED is inserted into the formed kernel. To this end, the cavity may be slightly larger than the LED. Preferably, the cavity walls form a tight fit with the LED (or LED board). More preferably, the LED (or LED board) is fixed within the cavity with a material that has an index of refraction which matches that of the CPC material.

Figure 2:
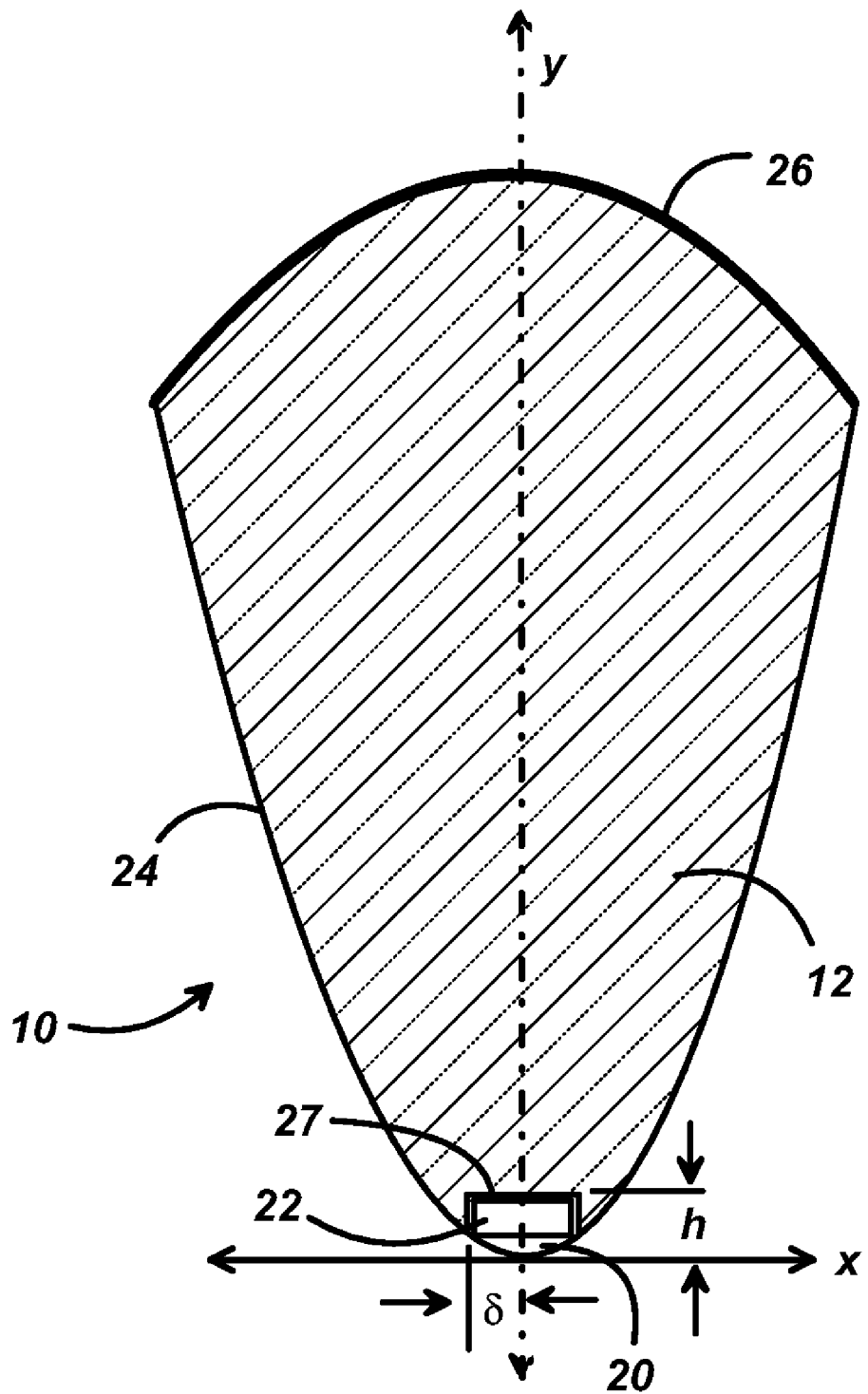
FIG. 2 is a cross section of a kernel of an embodiment of the present invention including a single LED.

FIG. 2 show a cross section with a single LED 22 in place in cavity 20. In this embodiment, cavity 20 is larger than LED 22 so that the LED can be inserted after formation of kernel 10. This also permits the LED to be removed from the kernel if a design changes.

The shape of sidewall 16 is defined by the following formula for the CPC:

$$y = \frac{(x-\delta)^2}{4h}$$

where δ is a half width and h is a height of cavity 20 (or of LED 22).

The focal point of the inverted parabola of revolution of the domed top 14 is desirably located at a top 27 of cavity 20 (or top of LED 22).

The exterior surface of sidewall 16 may include a reflective coating 24 to ensure internal reflection of light from the LED. Reflective coating 24 is not needed if the index of refraction of the material forming body 12 is greater than 1.6 as this material will internally reflect without the coating. The material forming body 12 may be a polymer or glass, or other suitable material. Desirably, when producing white light the index of refraction of the material forming body 12 is substantially the same as an index of refraction of the LED (about 2.6) to enhance extraction of blue light.

The exterior surface of domed top 14 may be coated with a phosphor coating 26 that may be a type suitable for the particular light color desired (e.g., a yellow-emitting phosphor with a blue-emitting LED produces white light.) Providing coating 26 on the exterior surface of domed top 14 places the phosphor as far away as possible from the LED which reduces the lumen degradation caused by heat from the LED. Further, the arrangement of the LED in the cavity helps insulate the body from the heat.

Figure 3:
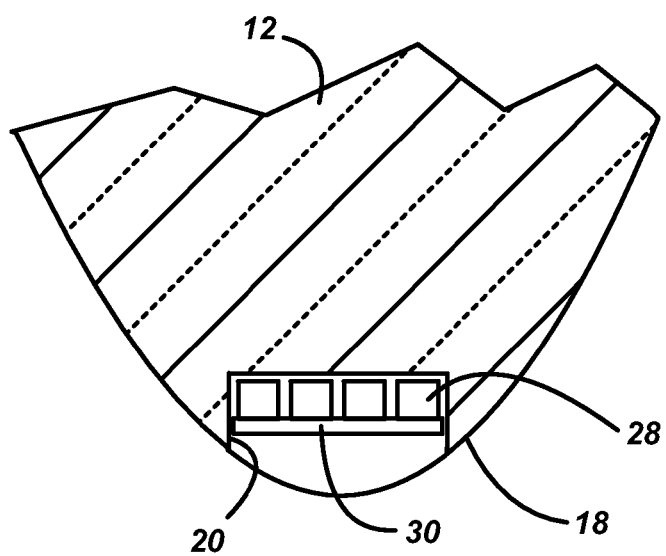
FIG. 3 is a partial cross section of a kernel of an embodiment of the present invention including plural LEDs on a board.

In an alternative embodiment shown in FIG. 3 (showing only the bottom portion of body 12), the cavity may receive a plurality of LEDs 28 on LED board 30. In this event, the CPC is defined by $$y = \frac{(x-\delta)^2}{4h}$$

where δ is a half width of board 30 and h is a height of LEDs 28.

LEDs 28 may be the same color or different colors and operated separately so that a single kernel can provide various light colors.

In the embodiment of FIG. 3, the shape of the CPC may be changed to accommodate board 30. At each side of the board, the parabola may be extended along each side edge so that the focal point becomes a line of focal points and the parabolic curve becomes a parabolic surface. Thus, there may be four sections (for a board with four sides) of the extended parabola that intersect at the respective corners of the board.

A method of making the above-described light engine kernel 10 containing LED 22, 28 includes the steps of forming this kernel and thereafter inserting LED 22 (or LEDs 28 on board 30) into the formed kernel. The phosphor coating may be applied to the exterior surface of the domed top before inserting the LED into the cavity.

While embodiments of the present invention have been described in the foregoing specification and drawings, it is to be understood that the present invention is defined by the following claims when read in light of the specification and drawings.

I claim:

1. A light engine kernel for a light emitting diode (LED), the kernel comprising: a solid body of transparent material having an index of refraction of at least 1.5, said body having a domed, light-emitting top that is an inverted parabola of revolution, an internally reflective sidewall that is a compound parabolic concentrator (CPC), and a bottom having a cavity therein at a focus of the CPC that is adapted to receive an LED, the CPC being defined by $$y = \frac{(x-\delta)^2}{4h}$$

where δ is a half width and h is a height of said cavity.

2. The kernel of claim 1, in combination with an LED in said cavity, wherein said cavity is larger than said LED.

3. The kernel of claim 1, wherein said cavity is adapted to removably receive the LED.

4. The kernel of claim 1, wherein a focal point of the inverted parabola of revolution is located at a top of said cavity.

5. The kernel of claim 1, further comprising a reflective coating on an exterior surface of said sidewall.

6. The kernel of claim 1, further comprising a phosphor coating on an exterior surface of said domed top.

7. The kernel of claim 6, wherein said phosphor coating comprises at least one of a yellow-emitting, green-emitting, and red-emitting phosphor.

8. The kernel of claim 6, in combination with a blue-emitting LED in said cavity, wherein said phosphor coating comprises a yellow-emitting phosphor.

9. The kernel of claim 1, in combination with an LED in said cavity, wherein the index of refraction of said transparent material is substantially the same as an index of refraction of said LED.

10. The kernel of claim 1, in combination with only a single LED in said cavity.

11. The kernel of claim 1, in combination with a plurality of LEDs on an LED board in said cavity.

12. The kernel of claim 1, wherein said transparent material is one of a polymer and glass.

13. The kernel of claim 1, in combination with a plurality of LEDs on an LED board in said cavity, wherein the CPC comprises a plurality of parabolic surfaces each extending from a side of the LED board and intersecting with each other at a corner of the board.

14. A light engine kernel, comprising:
a solid body of transparent material having an index of refraction of at least 1.5, said solid body having a domed, light-emitting top that is an inverted parabola of revolution, an internally reflective sidewall that is a compound parabolic concentrator (CPC), and a bottom having a cavity therein at a focus of the CPC;
a phosphor coating on an exterior surface of said domed top; and
a light emitting diode (LED) mounted in said cavity, said cavity being adapted to receive said LED,
wherein a focal point of the inverted parabola of revolution is located at a top of said LED, and
wherein the CPC is defined by $$y = \frac{(x-\delta)^2}{4h}$$

where δ is a half width and h is a height of said LED.

15. The kernel of claim 14, wherein said LED is a blue-emitting LED and said phosphor coating comprises a yellow-emitting phosphor.

16. The kernel of claim 15, wherein the index of refraction of said transparent material is substantially the same as an index of refraction of said blue-emitting LED.

17. The kernel of claim 14, in combination with a plurality of LEDs on an LED board in said cavity, wherein the CPC comprises a plurality of parabolic surfaces each extending from a side of the LED board and intersecting with each other at a corner of the board.

18. A method of making a light engine kernel containing a light emitting diode (LED), the method comprising the steps of:
forming a kernel with a solid body of transparent material having an index of refraction of at least 1.5, the body having a domed, light-emitting top that is an inverted parabola of revolution, an internally reflective sidewall that is a compound parabolic concentrator (CPC), and a bottom having a cavity therein at a focus of the CPC, the CPC being defined by $$y = \frac{(x-\delta)^2}{4h}$$

where δ is a half width and h is a height of said cavity; and
thereafter inserting the LED into the formed kernel.

19. The method of claim 18, further comprising the step of adding a phosphor coating on an exterior surface of the domed top before inserting the LED into the cavity.

* * * * *